United States Patent
Paul et al.

(10) Patent No.: US 12,306,282 B2
(45) Date of Patent: May 20, 2025

(54) AVOIDING ARTIFACTS IN IMAGE DATA RECONSTRUCTED FROM MEASUREMENT DATA ACQUIRED BY MEANS OF A TURBO SPIN ECHO SEQUENCE

(71) Applicant: Siemens Healthineers AG, Forchheim (DE)

(72) Inventors: Dominik Paul, Bubenreuth (DE); Mario Zeller, Erlangen (DE); Flavio Carinci, Würzburg (DE)

(73) Assignee: Siemens Healthineers AG, Erlangen (DE)

( * ) Notice: Subject to any disclaimer, the term of this patent is extended or adjusted under 35 U.S.C. 154(b) by 155 days.

(21) Appl. No.: 18/136,401

(22) Filed: Apr. 19, 2023

(65) Prior Publication Data
US 2023/0349996 A1    Nov. 2, 2023

(30) Foreign Application Priority Data
Apr. 29, 2022    (DE) ............... 10 2022 204 242.5

(51) Int. Cl.
*G01R 33/561*    (2006.01)
*G01R 33/54*    (2006.01)
*G01R 33/56*    (2006.01)

(52) U.S. Cl.
CPC ....... *G01R 33/5617* (2013.01); *G01R 33/543* (2013.01); *G01R 33/5608* (2013.01)

(58) Field of Classification Search
None
See application file for complete search history.

(56) References Cited

U.S. PATENT DOCUMENTS

| 5,378,985 A | 1/1995 | Hinks |
| 2023/0243908 A1* | 8/2023 | Li ............... G01R 33/4824 324/309 |

* cited by examiner

*Primary Examiner* — Rodney E Fuller
(74) *Attorney, Agent, or Firm* — Banner & Witcoff Ltd.

(57) ABSTRACT

A method for avoiding artifacts in image data reconstructed from measurement data acquired by means of a TSE (turbo spin echo) sequence with a coil having a plurality of antenna elements associated with one channel respectively. The method includes loading the measurement data, acquired with the coil, of all channels of the coil; loading at least the first three echo signals respectively of an echo train from phase correction measurement data of all channels acquired with the coil in relation to the TSE sequence; determining a step value d for each channel of the coil from the loaded phase correction measurement data, which value describes a signal drop in the three successive echo signals of the phase correction measurement data; channel-by-channel manipulation of the measurement data as a function of the step value of the respective channel; and reconstructing image data by taking into account the manipulated measurement data.

14 Claims, 3 Drawing Sheets

AVOIDING ARTIFACTS IN IMAGE DATA RECONSTRUCTED FROM MEASUREMENT DATA ACQUIRED BY MEANS OF A TURBO SPIN ECHO SEQUENCE

TECHNICAL FIELD

The disclosure relates to a method for avoiding artifacts in image data reconstructed from measurement data acquired by means of a turbo spin echo sequence, in particular with a coil comprising a plurality of antenna elements associated with one channel respectively.

BACKGROUND

Magnetic resonance technology (hereinafter the abbreviation MR stands for magnetic resonance) is a known technology with which images of the inside of an examination object can be generated. In simple terms, the examination object is positioned for this purpose in a magnetic resonance device in a comparatively strong, static, homogeneous basic magnetic field, also called the $B_0$ field, having field strengths of 0.2 tesla to 7 tesla and above, so the nuclear spins thereof oriented themselves along the basic magnetic field. In order to induce nuclear spin resonances which can be measured as signals, radio-frequency excitation pulses (RF pulses) are irradiated into the examination object, the induced nuclear spin resonances are measured as what is known as k-space data and MR images are reconstructed or spectroscopy data is ascertained on the basis thereof. For spatial encoding of the measurement data, fast-switched magnetic gradient fields, called gradients for short, are overlaid on the basic magnetic field. One pattern which is used, which describes a sequence over time of RF pulses to be irradiated and gradients to be switched, is referred to as a pulse sequence (pattern), or also as a sequence for short. The recorded measurement data is digitized and stored in a k-space matrix as complex numerical values. An associated MR image can be reconstructed from the k-space matrix occupied by values, for example by means of a multi-dimensional Fourier transform.

The arguably most frequently used method for generating echo signals following an excitation of the nuclear spins is what is known as the spin echo method. In the simplest case, by irradiating at least one RF refocusing pulse after irradiation of the RF excitation pulse, the transversal magnetization is as it were "turned", whereby the dephased magnetization is rephased again and thus what is known as a spin echo SE is generated after a time TE, referred to as the echo time, after the RF excitation pulse.

The excitation and measurement of the generated echo signals are repeated after a repetition time TR until (for example by switching different gradients for spatial encoding) the desired number of echo signals have been measured and stored in the k-space to be able to map the examination object.

Among the SE sequences, in particular the TSE sequences (TSE: "Turbo Spin Echo"), which are also known by the name FSE ("Fast Spin Echo") or RARE ("Rapid Acquisition with Refocused Echoes") sequences, are popular in clinical use. The advantage of the TSE sequences over the "straightforward" SE sequence is that after an RF excitation pulse, a plurality of refocusing pulses are switched, and that thereby a plurality of spin echo signals SE are also generated after an excitation. Reference is also made to an echo train after a joint excitation. Data acquisition is accelerated thereby since fewer repetitions of the sequence with different spatial encoding are required to measure all desired data. The measuring time for the entire k-space is reduced therewith in the case of TSE sequences in accordance with the number of echo signals refocused and acquired after an excitation, what is known as the "turbo factor", compared to conventional SE methods.

FIG. 1 shows a simplified TSE sequence diagram. In the top line RF this represents the irradiated RF pulses, in the second line Sig. the generated echo signals, in the third line ADC the acquisition periods in which measurement data is acquired, and in the fourth line GR the gradient fields in the readout direction switched during acquisition. After an RF excitation pulse RF1 a number of RF refocusing pulses RF2 corresponding to the turbo factor follows, after which one echo signal E1, E2, E3, E4 respectively is generated and acquired. The signal strength of the successively generated echo signals drops exponentially here in accordance with the decay of the transversal magnetization (T2 decay). A linear drop in the strength of the echo signals E1, E2, E3, E4, . . . in accordance with a constant c can be approximately assumed over short periods. A signal difference D12 in the strength of the first echo signal E1 generated in the echo train and the second echo signal E2 generated in the echo train can be assumed as being approximately equal with an assumed linear drop in the strength of the signal to a signal difference D23 in the strength of the second echo signal E2 generated in the echo train and the third echo signal E3 generated in the echo train.

In order to compensate phase errors in TSE sequences, TSE sequences without phase encoding, also called phase correction measurements, are carried out in advance, which are used to compensate the phase errors that vary during the course of the echo signals of an echo train of the TSE sequence. For example, U.S. Pat. No. 5,378,985A describes phase correction measurements of this kind (called "prescan" there) and their use.

In the case of acquisition of magnetic resonance data for imaging, in particular in the case of cross-sectional acquisitions of examination objects to be acquired, artifacts can occur in planes, which run substantially perpendicularly to the center axis of the tunnel opening. For example in examinations of a spinal column, phantom-like stripes can occur as artifacts in the reconstructed image data, and these typically extend in the phase encoding direction. If such artifacts overlay the structure for mapping in the image data, for example a spinal column, then this can result in impairment of a diagnosis that is to be made on the basis of the image data.

SUMMARY

It is therefore an object of the present disclosure to disclose a method for acquiring magnetic resonance data, a magnetic resonance system, a computer program and an electronically readable data carrier, which avoid or at least reduce said artifacts.

The object is achieved by a method as claimed in claim 1, a magnetic resonance system as claimed in claim 11, a computer program as claimed in claim 12 and an electronically readable data carrier as claimed in claim 13.

The disclosed subject matter is based on the following finding:

The artifacts emerge in a region outside of the field of view (FOV) to be acquired, but which is located within a slice to be acquired and therefore contributes to imaging, although incorrect localization of the signal occurs owing to non-linearities in the switched gradient fields.

An occurrence of the described phantom artifacts thus depends on the presence of signal-emitting tissue in an acquired slice in a region outside of the FOV and a strength of the non-linearity of the switched gradient fields that occurs in this region. With customary receive coils having a plurality of antenna elements, which each receive echo signals and are accommodated in one channel respectively of the receive coils, in particular those channels whose antenna elements, during acquisition, are positioned close to a described region outside of the FOV with signal-emitting tissue and sufficiently strong non-linearities in the switched gradient fields are affected by said artifacts.

With turbo spin echo sequences, the first echo signal, which is generated and acquired after the irradiated RF excitation pulse, is a pure spin echo, all further echo signals generated and read out after the first echo signal in the TSE sequence after the joint RF excitation pulse in the echo train are in each case a combination of spin echo and stimulated echo with potentially different phases, however. Signal differences in the strength of the echo signals can consequently result between successive echo signals of the echo train, in particular between the first echo signal and the echo signals of the echo train following the first echo signal, which differences do not correspond to the anticipated signal drop. The above-mentioned components of tissue situated outside of the FOV with non-linearities of the gradient fields can contribute further to the signal differences between the echo signals of an echo train. Erratic signal differences in the measurement data measured in the k-space result in local signal enhancements in the image data reconstructed from the measurement data by means of Fourier transform and thus generate said phantom artifacts.

The problem becomes particularly apparent in magnetic resonance systems with strong non-linearities in the switched gradient fields, as occur primarily in less expensive magnetic resonance systems.

A disclosed method for avoiding artifacts in image data reconstructed from measurement data acquired by means of a TSE (turbo spin echo) sequence having a coil comprising a plurality of antenna elements associated with one channel respectively comprises the following steps:

loading the measurement data, acquired with the coil, of all channels of the coil, loading at least the first three echo signals respectively of an echo train from phase correction measurement data of all channels of the coil acquired with the coil in relation to the TSE sequence, determining a step value d for each channel of the coil from the loaded phase correction measurement data, which describes a signal drop in the at least three successive echo signals of the phase correction measurement data, channel-by-channel manipulation of the measurement data as a function of the step value of the respective channel, reconstructing image data by taking into account manipulated measurement data.

The measurement data can be manipulated by a disclosed channel-by-channel analysis in such a way that signal components resulting in artifacts do not need to be considered, or only need to be considered to a reduced extent, in reconstruction. Consequently, artifacts can be significantly reduced or even avoided, whereby the image quality is improved.

A disclosed magnetic resonance system comprises a magnetic unit, a gradient unit, a radio-frequency unit and a control facility embodied to carry out A disclosed method, having a manipulation unit.

A disclosed computer program implements A disclosed method on a control facility when it is executed on the control facility.

The computer program can also be in the form of a computer program product here, which can be loaded directly into a memory unit of a control facility, having program code means in order to carry out A disclosed method when the computer program product is executed in the computing unit of the computing system.

A disclosed electronically readable data carrier comprises electronically readable control information stored thereon, which comprises at least one inventive computer program and is embodied in such a way that it carries out a disclosed method when the data carrier is used in a control facility of a magnetic resonance system.

The advantages and statements disclosed in relation to the method also apply analogously to the magnetic resonance system, the computer program product and the electronically readable data carrier.

BRIEF DESCRIPTION OF THE DRAWINGS

Further advantages and details of the present disclosure can be found in the exemplary embodiments described below as well as with reference to the drawings. The specified examples do not constitute a limitation of the disclosed subject matter. In the drawings.

DETAILED DESCRIPTION

Figure 2:
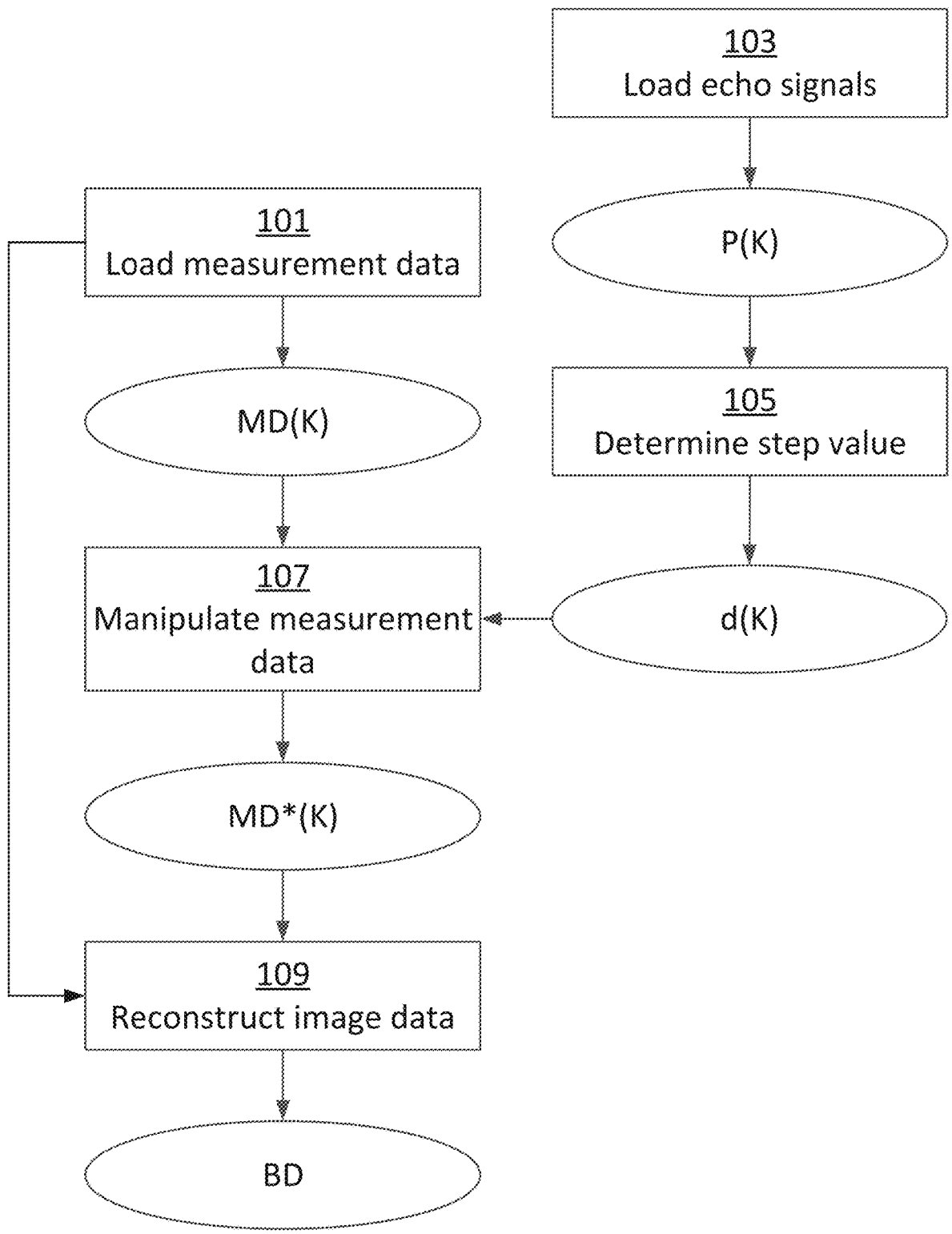
FIG. 2 shows a schematic flowchart of an disclosed method.

FIG. 2 is a schematic flowchart of a disclosed method for avoiding artifacts in image data reconstructed from measurement data acquired by means of a TSE sequence having a coil comprising a plurality of antenna elements associated with one channel respectively.

The measurement data MD(K), acquired with the coil with the TSE sequence, of all channels K of the coil is loaded (block 101).

Figure 1:
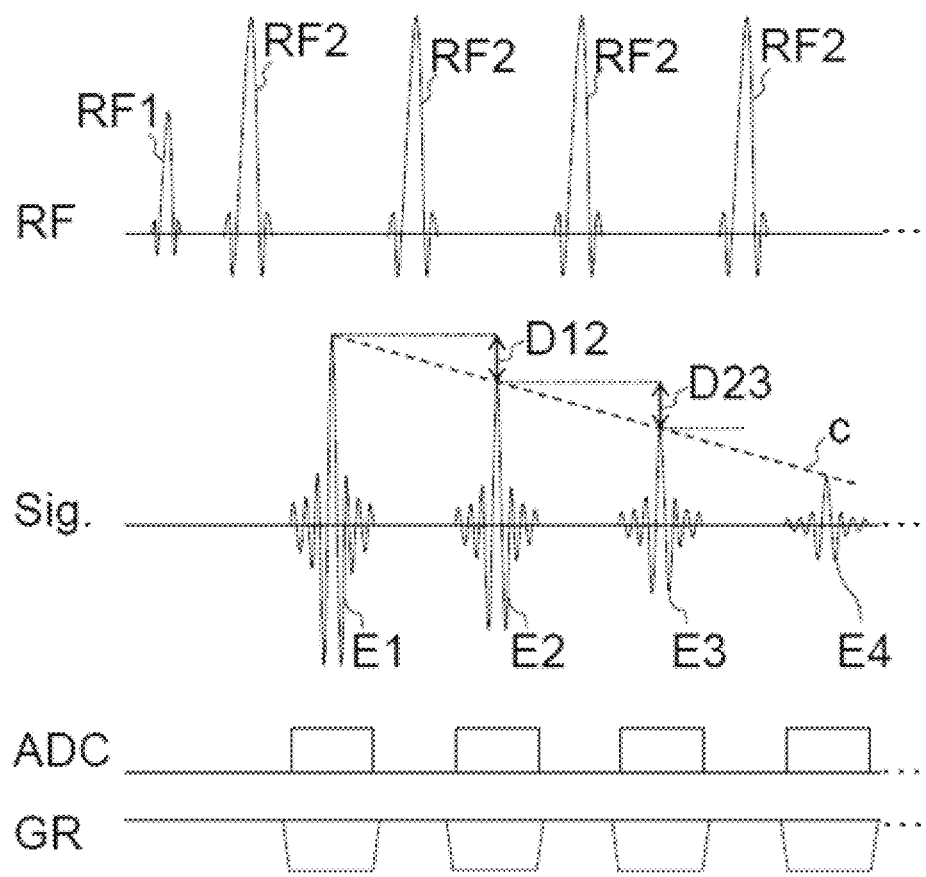
FIG. 1 shows a schematic representation of a TSE sequence.

At least the first three acquired echo signals respectively of an echo train are loaded (block 103) from phase correction measurement data P(K) of all channels K of the coil acquired with the same coil in relation to the TSE sequence, and thereby with the TSE sequence but without phase encoding. Phase correction measurements of this kind, in which substantially the same TSE sequence, for example a TSE sequence represented in FIG. 1, is used for acquisition of the phase correction measurement data as for acquisition of the measurement data measured for image reconstruction, but without phase encoding, has already been described above. In FIG. 1 said first three acquired echo signals of an echo train would correspond to the echo signals E1, E2 and E3.

A step value d(K) is determined (block 105) from the loaded phase correction measurement data P(K) for each channel K of the coil. A step value d(K) describes a signal drop in the at least three successive echo signals of the phase correction measurement data.

Determining the step value can comprise determining one first signal difference D12 and one second signal difference D23 per channel K, with the first signal difference D12 being a difference between the signal strengths of the first echo signal E1 and the second echo signal E2 of a channel K, and the second signal difference D23 being a difference between the signal strengths of the second echo signal E2 and the third echo signal E3 of the channel K.

A signal strength of an echo signal E1, E2, E3 can be determined an at echo instant of the echo signal, in other words, at the instant at which the echo signal E1, E2, E3 is strongest (in the center of the echo signal E1, E2, E3). It is also conceivable that a signal strength of an echo signal E1, E2, E3 is determined from signal values of a region comprising the echo instant of the respective echo signal E1, E2, E3, for example of a region arranged symmetrically around the echo instant in the acquisition period of the echo signal E1, E2, E3 or a region which corresponds to the entire acquisition period of the echo signal E1, E2, E3, for example in that signal values of the region are added up and/or averaged.

The determined signal differences D12, D23 can be used when determining the step value d(K), for example in that determining the step value d(K) comprises comparison of the first and second signal differences D12, D23. It is possible to identify noticeably erratic signal differences by way of such a comparison. In particular, determining a ratio of the determined signal differences is one example of a comparison of the signal differences D12, D23. A ratio of the signal differences reflects a relationship of the determined signal differences and approaches the value 1 when the signal differences are approximately equal. For example for each channel, the ratio D23/D12 of the second signal difference D23 to the first signal difference D12 can be determined as the step value d(K).

It is also conceivable to determine as a comparison a difference in the first signal difference D12 and the second signal difference D23, optionally with value formation.

The loaded measurement data MD(K) is manipulated channel-by-channel as a function of the step value d(K) of the respective channel K, so the measurement data MD(K) becomes measurement data MD*(K) manipulated by way of the manipulation (block 107).

The manipulation of the measurement data MD(K) can comprise sorting the channels K in accordance with their determined step value d(K), for example with decreasing step value d(K). This can facilitate identification of channels having step values d(K), which indicate artifact-generating, interfering signal components, for example step values d(K) that differ significantly from the majority of the channels.

The manipulation of the measurement data MD(K) can comprise selecting channels K whose measurement data is to be manipulated as a function of the step values of the channels. In this way, channels whose measurement data is regarded, in accordance with the associated step value d(K), as not being loaded with interfering signal components, or at the most slightly loaded, and which are thus not selected for a manipulation, can be identified. This kind of measurement data "of non-selected" channels (K) can be used without manipulation for a reconstruction of image data BD.

Selecting channels (K) whose measurement data MD(K) is to be manipulated can comprise determining channels K whose step value d(K) differs by more than a permitted value g from a selected selection limit value X. The selection value X and the permitted value g are selected in such a way that channels affected by interfering signal components can be selected. Channels K determined in this way can be selected for manipulation.

Depending on the step value d(K) used the selection value X can disclose, for example, a limit value, which must not be overshot by the step values (when the permitted value g stipulates that d(K) may not be greater than the selection value X) or undershot (when the permitted value g stipulates that d(K) may not be less than the selection value X). For example, if a difference in the signal differences D12 and D23 was selected as the step value d(K), a maximum permitted difference in the signal differences D12 and D23 can be specified as the selection value X, with the permitted value g thus stipulating here that the selection value X may only be undershot, but not overshoot, otherwise the affected channel K is selected for manipulation.

It is also conceivable that the selection value X is selected as a mean or preferably a median of the step values d(K) of the channels K and the permitted value g for example a maximum difference of up to 50% of the mean or of the median of the step values d(K) of the channels.

If the ratio D23/D12 of the signal differences D12 and D23 was selected as the step value d(K), and it is anticipated that due to the interfering signal components (for example due to the proportions of stimulated echoes contained in the second echo signal E2), the second signal difference D23 will be greater than without interfering signal components, the selection value X can be selected as the limit value, so channels K having step values d(K)=D23/D12, which lie above the selection value X, are selected for manipulation.

It is also conceivable that when a ratio of the signal differences D12 and D23 is used as the step value d(K), the selection value X=1 is set since, as described above, without interfering signal components (and without phase errors) it would be anticipated that the signal differences D12 and D23 are approximately equal.

Selecting channels K whose measurement data MD(K) is to be manipulated can comprise determining a selection percentage x % of the channels K, which of the channels K is selected for manipulation. The selection percentage x % can be, for example, 10%, 20%, 25%, or up to 33%. Using a selection percentage x % ensures that a proportion of the channels K selected by the selection percentage x % is selected for manipulation. At the same time this avoids the situation where more than the selection percentage x % of the channels K is selected for manipulation.

Within the framework of use of a selection percentage x % in combination with a selection value X, the permitted value g can be selected, for example, in such a way that precisely the desired selection percentage x % of the channels K is selected for manipulation.

The selection percentage x % can also be used as a specification for a maximum number of channels K of the channels K to be selected for manipulation, so undershooting of the selection percentage x % when selecting the channels for manipulation is permitted. In this way, the situation where too many channels are selected for manipulation continues to be avoided, and this ensures, for example in the case of a manipulation by way of separation described in more detail below, that sufficient measurement data for the reconstruction of the image data is still not separated.

Manipulation of the measurement data MD(K) can comprise separating measurement data MD(K) of the selected channels K whose measurement data MD(K) is to be manipulated. Measurement data MD(K), separated by manipulation of this kind, of the selected (for separation, therefore) channels K is not used for a reconstruction of image data BD. Interfering signal components contained in the measurement data MD(K) of selected channels K is thus not included in the reconstruction of image data.

Alternatively, the manipulation of the measurement data can also comprise scaling a signal value of a first echo signal E1 of an echo train from measurement data MD(K) of a channel K, wherein scaling with a scaling factor s(K) determined as a function of the step values d(K) of the channels K takes place in such a way that artifacts are avoided.

The scaling factor s(K) for a channel K can be determined in this case, for example, likewise using the at least first three echo signals E1, E2, E3 respectively of an echo train from phase correction measurement data P(K) of the channels K of the coil acquired with the coil in relation to the TSE sequence.

In particular, the scaling factor s(K) for a channel K can be determined from the determined step values d(K) of the channels. This can take place, for example, in that the factor is determined by which a first echo signal E1, which was used for determination of the step value d(K) of the channel, whose first echo signal E1 of the measured values MD(K) is to be scaled, has to be multiplied in order to scale the step value d(K) of the channel to a mean step value d'. The first echo signal E1 of the measured values MD(K) of the channel K to be scaled is then likewise scaled with the scaling factor s(K) determined in this way as a factor, whereby artifacts in the image data BD are reduced by using the measurement data MD(K) manipulated by scaling.

The mean step value d' can be a mean or, preferably, a median of the step values d(K) of all channels K of the coil or a mean step value d' of all channels K not selected for manipulation. Depending on the step value d(K) used, further mean step values d', which can be used for determination of the scaling factor s(K), are also conceivable. For example, when using a ratio of the signal differences D12 and D23, the "ideal" value 1 can be stipulated as the mean step value d'.

Signal values of first echo signals E1 of the measurement data of all channels K can be scaled with the scaling factor s(K) associated with the channel, or only signal values of first echo signals E1 of the measurement data from channels K selected as described above for manipulation can be scaled with the scaling factor s(K). If only signal values of first echo signals E1 of the measurement data from selected channels K is scaled with the scaling factor s(K), the computing effort is reduced and interfering signal components are still effectively avoided or at least reduced.

By taking into account manipulated measurement data MD*(K), image data BD is reconstructed, which can be stored or processed further, for example displayed (block 109). If the measurement data of selected channels was manipulated by a described separation, the separated measurement data is not included in the reconstruction of the image data BD, so interfering signal components contained in the separated measurement data are avoided or at least reduced in the reconstruction. If the measurement data of selected channels was manipulated by described scaling, interfering signal components are reduced in the manipulated measurement data, so artifacts are avoided or reduced in image data reconstructed from the manipulated measurement data and optionally the measurement data of non-selected channels.

The achievable image quality is thus increased by the described channel-by-channel analysis of the measurement data and corresponding manipulation of the measurement data of the channels of the coil used.

Figure 3:
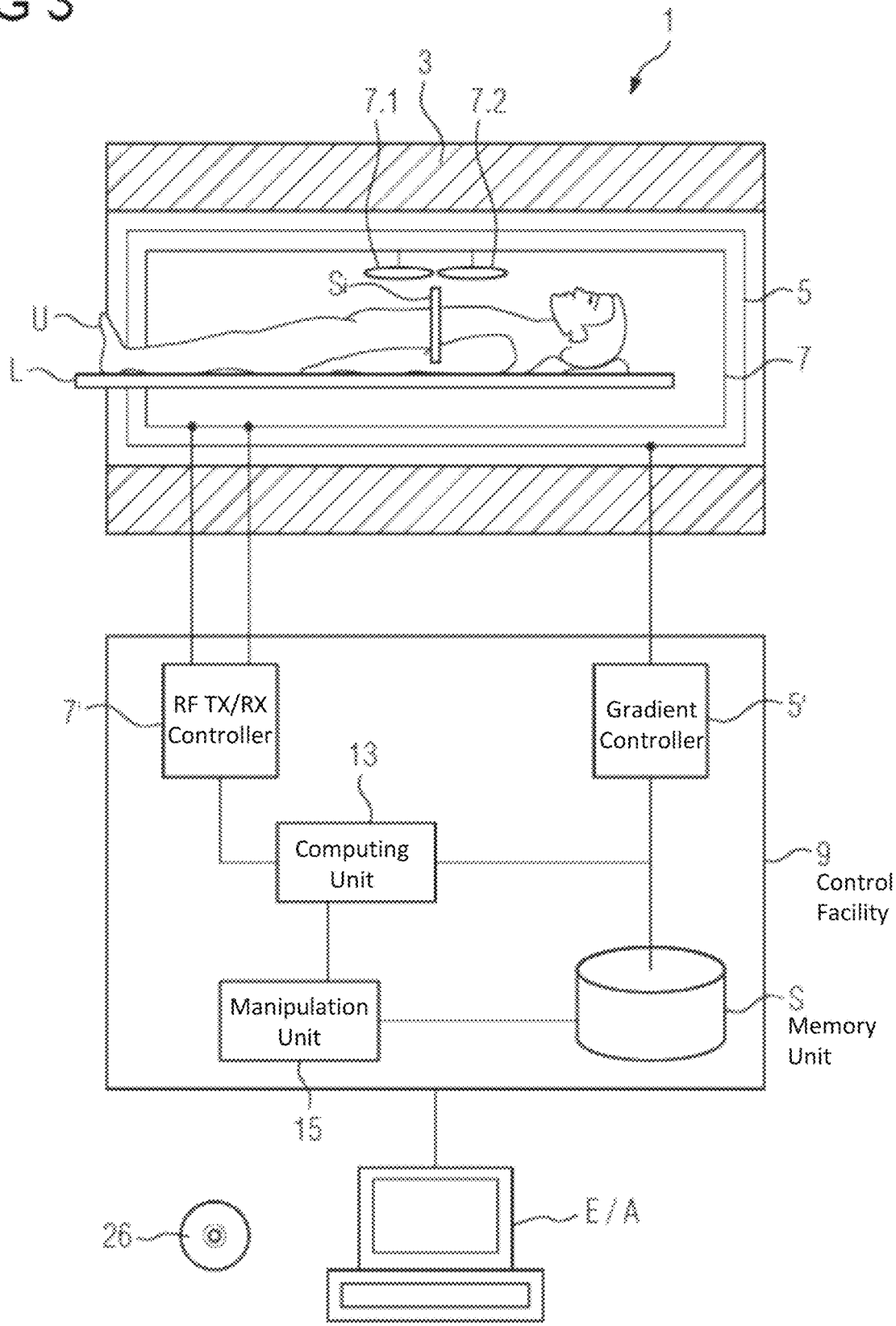
FIG. 3 shows a schematically represented disclosed magnetic resonance system.

FIG. 3 schematically represents a disclosed magnetic resonance system 1. This comprises a magnetic unit 3 for generating the basic magnetic field, a gradient unit 5 for generating the gradient fields, a radio-frequency unit 7 for irradiating and receiving radio-frequency signals and a control facility 9 embodied for carrying out a disclosed method.

FIG. 3 represents these partial units of the magnetic resonance system 1 only in a roughly schematic manner. In particular, the radio-frequency unit 7 can be composed of a plurality of sub-units, for example of a plurality of coils, which can either be embodied only for sending radio-frequency signals or only for receiving the induced radio-frequency signals or for both. At least one coil constructed for receiving comprises a plurality of antenna elements. FIG. 3 schematically represents antenna elements 7.1 and 7.1. Advantageously the coil used for the method described herein comprises at least six antenna elements with associated channels. For example, the coil can also comprise eight, 16, 32 or more antenna elements with respective channels.

In order to examine an examination object U, for example a patient or also a phantom, this object can be introduced on a couch L into the magnetic resonance system 1 in the measurement volume thereof. The slice or the slab $S_i$ represents an exemplary target volume of the examination object, from which echo signals are to be recorded and acquired as measurement data.

The control facility 9 serves to control the magnetic resonance system 1 and can control, in particular, the gradient unit 5 by means of a gradient controller 5' and the radio-frequency unit 7 by means of a radio-frequency transmit/receive controller 7'. The radio-frequency unit 7 can comprise a plurality of channels on which signals can be sent or received.

The radio-frequency unit 7, together with its radio-frequency transmit/receive controller 7', is responsible for generating and irradiating (sending) a radio-frequency alternating field for manipulation of the spins in a region for manipulation (for example in slices $S_i$ for measurement) of the examination object U. Generally speaking, the center frequency of the radio-frequency-alternating field, also referred to as the B1 field, is optimally set such that it lies close to the resonance frequency of the spins for manipulation. Deviations by the center frequency from the resonance frequency are referred to as off-resonance. Currents controlled by means of the radio-frequency transmit/receive controller 7' are applied to the RF coils in the radio-frequency unit 7 in order to generate the B1 field.

The control facility 9 also comprises a manipulation unit 15 with which all steps can be carried out to manipulate measurement data before image data is reconstructed from it. The control facility 9 is embodied as a whole to carry out a disclosed method.

A computing unit 13 encompassed by the control facility 9 is embodied to perform all computing operations necessary for the required measurements and determinations. Intermediate results and results required for this or ascertained in this connection can be stored in a memory unit S of the control facility 9. The represented units are not necessarily to be taken to mean physically separate units, instead merely representing a subdivision into meaningful units, but they can also be implemented, for example, in fewer units or also in just one single physical unit.

Control commands can be conveyed to the magnetic resonance system and/or results from the control facility 9, such as image data, can be displayed via an input/output facility E/A of the magnetic resonance system 1, for example by a user.

A method described herein can also be in the form of a computer program product, which comprises a program and implements the described method on a control facility 9 when it is executed on the control facility 9. Similarly, an electronically readable data carrier 26 with electronically readable control information stored thereon can be present, which comprises at least one such computer program product just described and is embodied in such a way that it carries out the described method when the data carrier 26 is used in a control facility 9 of a magnetic resonance system 1.

The invention claimed is:

1. A method for avoiding artifacts in image data reconstructed from measurement data acquired using a TSE (turbo spin echo) sequence with a coil having a plurality of antenna elements associated with one channel respectively, comprising:
    loading the measurement data, acquired with the coil, of all channels of the coil;
    loading at least a first three echo signals respectively of an echo train from phase correction measurement data of all channels of the coil acquired with the coil in relation to the TSE sequence;
    determining a step value for each channel of the coil from the loaded phase correction measurement data, which value describes a signal drop in the three successive echo signals of the phase correction measurement data;
    channel-by-channel manipulating the measurement data as a function of the step value of the respective channel; and
    reconstructing image data taking into account the manipulated measurement data.

2. The method as claimed in claim 1, wherein the determining the step value comprises determining a first signal difference and a second signal difference, wherein the first signal difference is a difference between signal strengths of the first echo signal and the second echo signal of a channel, and the second signal difference is a difference between the signal strengths of the second echo signal and the third echo signal of the channel.

3. The method as claimed in claim 2, wherein a signal strength of an echo signal is determined at an echo instant of the echo signal or is determined from signal values of a range of the echo signal encompassing the echo instant of the echo signal in that signal values of the range are added up or averaged.

4. The method as claimed in claim 2, wherein the determining the step value comprises determining a ratio of the determined signal differences.

5. The method as claimed in claim 1, wherein the manipulation of the measurement data comprises sorting the channels according to their determined step value.

6. The method as claimed in claim 1, wherein the manipulation of the measurement data comprises selecting channels, whose measurement data is to be manipulated, as a function of the step values of the channels.

7. The method as claimed in claim 6, wherein the selecting channels, whose measurement data is to be manipulated, comprises determining channels whose step value differs by more than one permitted value from a selected selection limit value, and these channels are selected for manipulation.

8. The method as claimed in claim 6, wherein the selecting channels, whose measurement data is to be manipulated, comprises determining a selection percentage of the channels, which of the channels is selected for manipulation.

9. The method as claimed in claim 6, wherein the selecting channels, whose measurement data is to be manipulated, comprises determining a selection percentage of 10% of the channels, which of the channels is selected for manipulation.

10. The method as claimed in claim 6, wherein the selecting channels, whose measurement data is to be manipulated, comprises determining a selection percentage of 33% of the channels, which of the channels is selected for manipulation.

11. The method as claimed in claim 6, wherein the manipulation of the measurement data comprises separating measurement data of the selected channels whose measurement data is to be manipulated.

12. The method as claimed in claim 1, wherein the manipulation of the measurement data comprises scaling a signal value of a first echo signal of an echo train from measurement data of a selected channel, wherein scaling takes place with a scaling factor determined as a function of the step values of the channels in such a way that artifacts are avoided.

13. A magnetic resonance system, comprising:
    a magnetic unit;
    a gradient unit;
    a radio-frequency unit; and
    a control facility having a radio-frequency transmit/receive controller and a manipulation unit, wherein the control facility is embodied to carry out a method as claimed in claim 1 on the magnetic resonance system.

14. A non-transitory electronically readable data carrier having electronically readable control information stored thereon, which comprises at least one computer program, which can be loaded directly into a memory unit of a control facility of a magnetic resonance system, having a program in order to carry out a method as claimed in claim 1 when the data carrier is used in a control facility of a magnetic resonance system.

* * * * *